United States Patent
Ha et al.

(10) Patent No.: US 8,004,023 B2
(45) Date of Patent: Aug. 23, 2011

(54) SEMICONDUCTOR DEVICE AND METHOD OF FABRICATING THE SAME

(75) Inventors: Dae-won Ha, Seoul (KR); Tae-hyun An, Seoul (KR); Min-young Shim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 635 days.

(21) Appl. No.: 12/000,504

(22) Filed: Dec. 13, 2007

(65) Prior Publication Data

US 2008/0179648 A1    Jul. 31, 2008

(30) Foreign Application Priority Data

Jan. 26, 2007   (KR) ................. 10-2007-0008610

(51) Int. Cl.
*H01L 29/76* (2006.01)

(52) U.S. Cl. ........ 257/288; 257/296; 257/300; 257/379; 257/532; 257/E29.034; 257/E29.345

(58) Field of Classification Search .......... None
See application file for complete search history.

(56) References Cited

U.S. PATENT DOCUMENTS

| | | | |
|---|---|---|---|
| 4,994,404 A | | 2/1991 | Sheng et al. |
| 5,989,967 A | | 11/1999 | Gardner et al. |
| 6,066,881 A | * | 5/2000 | Shimizu et al. ............... 257/392 |
| 6,252,281 B1 | * | 6/2001 | Yamamoto et al. ........... 257/350 |
| 6,344,692 B1 | * | 2/2002 | Ikemasu et al. ............... 257/758 |
| 2001/0005610 A1 | | 6/2001 | Fukase et al. |
| 2003/0015746 A1 | * | 1/2003 | Ida et al. ........................ 257/296 |

FOREIGN PATENT DOCUMENTS

| | | |
|---|---|---|
| KR | 94-16921 | 1/1996 |
| KR | 1999-0077754 | 10/1999 |
| KR | 10244413 B1 | 2/2000 |
| KR | 10-2005-0066688 A | 6/2005 |
| KR | 10-2005-0101030 | 10/2005 |

* cited by examiner

*Primary Examiner* — Minh-Loan T Tran
*Assistant Examiner* — Fei Fei Yeung Lopez
(74) *Attorney, Agent, or Firm* — Lee & Morse, P.C.

(57) ABSTRACT

A semiconductor device having a semiconductor substrate including a first region and a second region is provided. The semiconductor device further includes a gate electrode on the first region and having a first sidewall and a second sidewall, a first source region in the first region proximate to the first sidewall, a first drain region in the first region proximate to the second sidewall, an upper electrode on the second region and having a first sidewall and a second sidewall, a second source region in the second region proximate to the first sidewall of the upper electrode, and a second drain region in the second region proximate to the second sidewall of the upper electrode, wherein an impurity doping concentration of the first source region and the first drain region is greater than an impurity doping concentration of the second source region and the second drain region.

16 Claims, 5 Drawing Sheets

SEMICONDUCTOR DEVICE AND METHOD OF FABRICATING THE SAME

BACKGROUND OF THE INVENTION

1. Field of the Invention

Embodiments relate to a semiconductor device and a method of fabricating the same. In particular, the present invention relates to a semiconductor device including at least a transistor and a capacitor, and a method of fabricating a semiconductor device including at least a transistor and a capacitor.

2. Description of the Related Art

In general, semiconductor devices may include various types of integrated circuit components, such as one or more transistors and one or more capacitors. As one example, a semiconductor device may include at least one metal-oxide-semiconductor (MOS) transistor and at least one MOS capacitor.

Semiconductor devices such as those described above may be employed in an application. Depending at least in part on the application, a semiconductor device may be operated at an operation voltage. The operation voltage may at least partially affect reliability and efficiency of the semiconductor device. For example, a MOS capacitor may be operated at a high operation voltage when employed in a particular application. However, operating a MOS capacitor at a high operation voltage may degrade the reliability of the MOS capacitor, such as by degrading the reliability of a dielectric layer. For example, a leakage current through a dielectric layer of a MOS capacitor may be increased in response to an increase of operation voltage, which may result in a decrease in reliability and efficiency, and may additionally result in physical damage to the dielectric layer. Furthermore, while decreasing the operation voltage of a MOS capacitor may reduce or eliminate these undesirable effects, decreasing the operation voltage may result in the need to increase a dielectric layer area of the MOS capacitor, which may result in an increased cost and increased die area.

Accordingly, there remains a need for a semiconductor device and a method of forming a semiconductor device that addresses one or more of these concerns.

SUMMARY OF THE INVENTION

Embodiments are therefore directed to a semiconductor device and a method of forming a semiconductor device, which may overcome one or more of the disadvantages of the related art.

It is therefore a feature of an embodiment of the present invention to provide a semiconductor device including a capacitor and a transistor, wherein the structure of the capacitor is similar to that of the transistor.

It is another feature of an embodiment of the present invention to provide a method of fabricating a semiconductor device including a capacitor and a transistor, wherein the structure of the capacitor is similar to that of the transistor.

At least one of the above and other features of the present invention may be realized by providing a semiconductor substrate having a first region and a second region, a gate electrode formed on the first region and having a first sidewall and a second sidewall, a first source region formed in the first region proximate to the first sidewall of the gate electrode, a first drain region formed in the first region proximate to the second sidewall of the gate electrode, an upper electrode formed on the second region and having a first sidewall and a second sidewall, a second source region formed in the second region proximate to the first sidewall of the upper electrode, and a second drain region formed in the second region proximate to the second sidewall of the upper electrode, wherein an impurity doping concentration of the first source region and the first drain region is greater than an impurity doping concentration of the second source region and the second drain region.

In the semiconductor device, the impurity doping concentration of the first source region and the first drain region may be greater than that of the second source region and the second drain region by about 5 to 1000 times. Furthermore, in the semiconductor device, a depth of the second source region and the second drain region may be less than the depth of the first source region and the first drain region. For example, the depth of the second source region and the second drain region may be about ⅓ to ½ of the depth of the first source region and the first drain region.

The semiconductor device may further include plug regions extending from a surface of the second source region and the second drain region into the second region, wherein the plug regions are offset from the upper electrode.

At least one other of the above and other features and advantages of the present invention may be realized by providing a semiconductor substrate having a first region and a second region, forming a gate electrode on the first region, the gate electrode having a first sidewall and a second sidewall, forming a first source region in the first region proximate to the first sidewall of the gate electrode, forming a first drain region in the first region proximate to the second sidewall of the gate electrode, forming an upper electrode on the second region having a first sidewall and a second sidewall, forming a second source region in the second region proximate to the first sidewall of the upper electrode, and forming a second drain region in the second region proximate to the second sidewall of the upper electrode, wherein an impurity doping concentration of the first source region and the first drain region is greater than an impurity doping concentration of the second source region and the second drain region.

The at least one other of the above and other features and advantages of the present invention may be further realized by forming low density regions having a first impurity doping concentration in the first region proximate to the first sidewall and the second sidewall of the gate electrode, forming first spacer insulating layers on the first sidewall and the second sidewall of the gate electrode, and forming high density regions having a second impurity doping concentration greater than that first impurity doping concentration in the first region proximate to the first sidewall and the second sidewall of the gate electrode.

The second source region and the second drain region may be formed simultaneously with the formation of the low density regions, wherein the second source region and the second drain region are formed to have an impurity doping concentration equal to the first impurity doping concentration.

A mask layer may be formed on the second region prior to forming the high density region. Furthermore, a plug region extending from the surface of at least one of the second source region and the second drain region may be formed after forming the second source region or the second drain region, wherein the plug region may be formed to be offset from the upper electrode.

The impurity doping concentration of the first source region and the first drain region may be greater than that of the second source region and the second drain region by about 5 to 1000 times. Furthermore, a depth of the second source region and the second drain region may be less than that of the first source region and the first drain region. For example, the depth of the second source region and the second drain region may be about ⅓ to ½ of the depth of the first source region and the first drain region.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
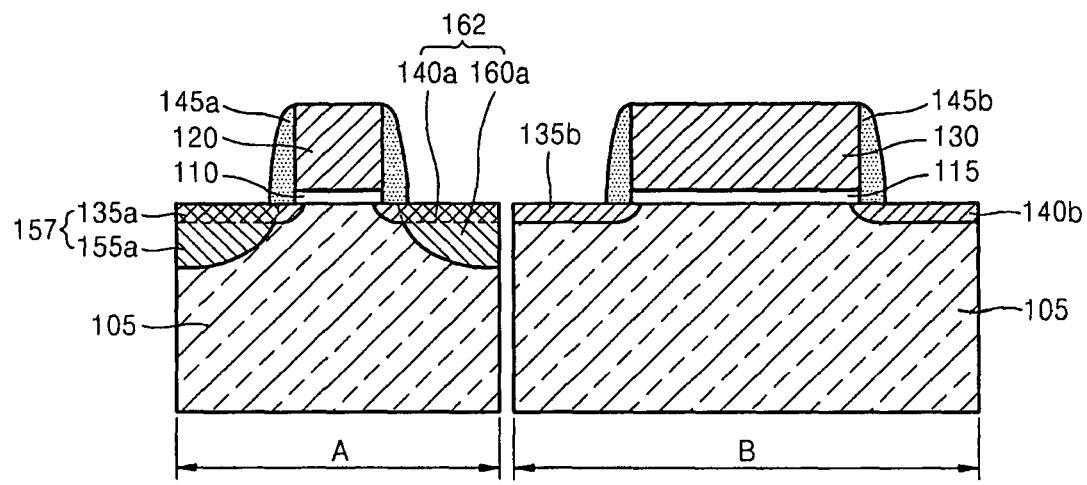
FIG. 1 illustrates a sectional view of a semiconductor device according to an embodiment of the present invention.

Korean Patent Application No. 10-2007-0008610, filed on Jan. 26, 2007, in the Korean Intellectual Property Office, and entitled: "Semiconductor Device and Method of Fabricating the Same," is incorporated by reference herein in its entirety.

The present invention will now be described more fully with reference to the accompanying drawings, in which exemplary embodiments of the invention are illustrated. The invention may, however, be embodied in different forms and should not be construed as being limited to the embodiments set forth herein. Rather, these embodiments are provided so that this disclosure will be thorough and complete, and will fully convey the concept of the invention to those skilled in the art.

In the figures, the dimensions of layers and regions are exaggerated for clarity of illustration. It will also be understood that when a layer or element is referred to as being "on" another layer or substrate, it may be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Furthermore, like reference numerals refer to like elements throughout.

In the embodiments of the present invention, the position of elements of the semiconductor device may be reversed. For example, the position of a source region and the position of a drain region of at least one embodiment of a semiconductor device may be reversed. Also, when numerical or percentage values such as concentration and depth of impurities in a source region or a drain region are presented, these numerical or percentage values may be construed as denoting an average value within the source region or the drain region.

An exemplary embodiment of the present invention will be described with reference to the sectional view of a semiconductor device as illustrated in FIG. 1.

Referring to FIG. 1, a semiconductor substrate 105 may include a first region A and a second region B. The first region A and the second region B may be positioned adjacent to one another, or, alternatively, may be positioned remotely from one another on the semiconductor substrate 105. If the first region A and the second region B are positioned adjacent to one another, a device isolation film (not shown) may be formed between them in at least one embodiment. The semiconductor substrate 105 may be formed from one or more materials, including silicon, germanium or silicon-germanium, for example, although those skilled in the art will appreciate that other materials not specifically named herein may be employed in at least one embodiment.

Furthermore, in one example application, the semiconductor substrate 105 may be employed as part of a memory device. In this example, the first region A includes a cell region, and the second region B includes a peripheral circuit region. In another example application, substrate 105 may be employed as part of a logic device. In this example, the first region A and the second region B may be positioned adjacent to one another on the semiconductor substrate 105.

However, continuing with this exemplary embodiment, the first region A of semiconductor substrate 105 may form a portion of a transistor. The transistor may have a metal-oxide-semiconductor (MOS) structure, for example. A gate insulating layer 110 may be on a top surface of semiconductor substrate 105. A gate electrode 120 may be on first region A by disposing a gate electrode 120 on the gate insulating layer 110. Gate electrode 120 may be formed from one or more materials, including doped polysilicon, metal silicide and metal, for example, although those skilled in the art will appreciate that other materials not specifically named herein may be employed in at least one embodiment.

The first region A may include a first source region 157 and a first drain region 162. The first source region 157 and the first drain region 162 may be formed by doping impurities into the first region A on both sides of the gate electrode 120. When formed, ends of the first source region 157 and the first drain region 162 may extend under respective sidewalls of the gate electrode 120. This may contribute to scattering or diffusion of impurities within the semiconductor substrate 105, for example.

For example, the first source region 157 may include a low density region 135a and a high density region 155a, and, similarly, the first drain region 162 may include a low density region 140a and a high density region 160a. The low density regions 135a and 140a may each have a first impurity doping concentration, and the high density regions 155a and 160a may each have a second impurity doping concentration. In this embodiment, the second impurity doping concentration of the high density regions 155a and 160a is greater than the first impurity doping concentration of the low density regions 135a and 140a. Furthermore, the low density regions 135a and 140a may overlap the high density regions 155a and 160a, respectively. For example, a portion of the low density regions 135a and 140a are illustrated as overlapping a portion of high density regions 155a and 160a, respectively. In this embodiment, the portions of low density regions 135a and 140a that overlap high density regions 155a and 160a may be difficult to classify in terms of density, and may be considered part of high density regions 155a and 160a, for example. Similarly, portions of low density regions 135a and 140a not overlapping with high density regions 155a and 160a may be classified as low density regions. First spacer insulating layers 145a may be on either sidewall of the gate electrode 120. The first spacer insulating layers 145a may include an oxide film or a nitride film. High density regions 155a and 160a may be separated from respective sidewalls of the gate electrode 120 by a predetermined distance by the first spacer insulating layers 145a. Portions of low density regions 135a and 140a that do not overlap high density regions 155a and 160a may extend under the first spacer insulating layers 145a. In operation, low density regions 135a and 140a may control generation of hot carriers by lowering an electrical field.

The second region B of semiconductor substrate 105 may form a portion of a capacitor. The capacitor may have a MOS structure, for example. A dielectric layer 115 may be disposed on a top surface of second region B of the semiconductor substrate 105. An upper electrode 130 may be formed on the second region B by disposing upper electrode 130 on the dielectric layer 115. The upper electrode 130 may have a width greater than a width of the gate electrode 120 formed on first region A. A width of upper electrode 130 may be greater than a width of the gate electrode 120 by several times to several hundreds of times.

The second region B may include a second source region 135b and a second drain region 140b. The second source region 135b and the second drain region 140b may be formed by doping impurities into second region B on both sides of the upper electrode 130. When formed, ends of the second source region 135b and second drain region 140b may extend under respective sides of upper electrode 130. This may contribute to scattering or diffusion of impurities within the semiconductor substrate 105, for example.

Second spacer insulating layers 145b may be disposed on both sidewalls of the upper electrode 130. For example, the second spacer insulating layers 145b may include an oxide film or a nitride film. Alternatively, the second spacer insulating layers 145b may be omitted.

Second source region 135b and second drain region 140b each have an impurity doping concentration. The impurity doping concentration of the second source region 135b and the second drain region 140b may be less than the impurity doping concentration of the first source region 157 and the first drain region 162 of first region A. Although not intending to be bound by theory, providing an impurity doping concentration in the second source region 135b and the second drain region 140b that is less than the impurity doping concentration of first source region 157 and first drain region 162 of first region A may result in a decrease in the leakage current through the dielectric layer 115 of the capacitor. For example, the impurity doping concentration of first source region 157 and first drain region 162 in first region A may be greater than that of the second source region 135b and the second drain region 140b of second region B by about 5 to 1000 times. However, if the impurity doping concentration of the first source region 157 and the first drain region 162 in first region A is greater than that of the second source region 135b and the second drain region 140b of second region B by less than or equal to 5 times, a decrease in the leakage current through the dielectric layer 115 may not be significant. Additionally, it may be difficult or impractical to form the first source region 157 and the first drain region 162 having an impurity doping concentration greater than about 1000 times of that of the impurity doping concentration of the second source region 135b and the second drain region 162.

Second source region 135b and second drain region 140b may each be formed to a depth. The depth of the second source region 135b and the second drain region 140b may be less than a depth of the first source region 157 and the first drain region 162 of first region A. For example, the depth of the second source region 135b and the second drain region 140b may be about ⅓ to ½ of the depth of the first source region 157 and the first drain region 162.

Figure 7:
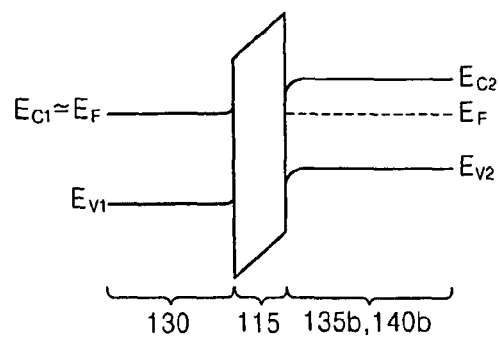
FIG. 7 illustrates an energy band diagram at an equilibrium state with respect to a parasitic capacitor of the semiconductor device illustrated in FIG. 1.

In operation, the impurity doping concentration of the second source region 135b and the second drain region 140b may influence an electrical field, which may exert upon the peripheries of the dielectric layer. For example, the second source region 135b and the second drain region 140b may form a parasitic capacitor with the peripheries of the upper electrode 130. FIG. 7 illustrates an energy band diagram at an equilibrium state with respect to the parasitic capacitor of one embodiment of the semiconductor device illustrated in FIG. 1.

As illustrated in FIG. 7, in one embodiment of the semiconductor device of FIG. 1, the upper electrode 130 of the second region B may include a metal or polysilicon, and may be doped to an impurity density with an impurity of a second conductivity type. In this embodiment, a Fermi level $E_F$ in the upper electrode 130 may be nearly congruous with a conduction band $E_{C1}$, and may be offset from a balance band $E_{V1}$ as much as a band gap. Without being bound by theory, this may be due at least in part to the upper electrode 130 including a metal or polysilicon and being doped with an impurity density of a second conductivity type. However, as illustrated in the energy band diagram of FIG. 7, the Fermi level $E_F$ of the second source region 135b or the second drain region 140b may be located between the balance band $E_{V2}$ and the conduction band $E_{C2}$, which may be due at least in part to the impurity doping concentration of the second source region 135b or the second drain region 140b. For example, the Fermi level $E_F$ of second source region 135b or the second drain region 140b may be offset from the conduction band $E_{C2}$ when the impurity doping density is lower than that of upper electrode 130.

Therefore, as the Fermi levels $E_F$ of the upper electrode 130 and Fermi levels $E_F$ of the second source region 135b or the second drain region 140b are congruous in the equilibrium state, the conduction band $E_{C2}$ and the balance band $E_{V2}$ of the second source region 135b or the second drain region 140b may skew downward to form an accumulation layer. Thus, in at least one embodiment, a built-in potential is formed within the dielectric layer 115.

In this embodiment, when an operation voltage is supplied to the second source region 135b and the second drain region 140b, the electrical field within the dielectric layer 115 may be decreased such as to reduce or eliminating a built-in potential. Accordingly, as the distance between the Fermi level $E_F$ of the second source region 135b and the second drain region 140b and the conduction band $E_{C2}$ increases, i.e., as the impurity doping concentration decreases, the electrical field in the peripheries of the dielectric layer 115 may be decreased when operating the capacitor. The decreased electrical field may result in an improvement of reliability of the dielectric layer 115, as will be explained in more detail later. Consequently, in at least one embodiment, the operation voltage of a capacitor according to an embodiment may not have to be decreased, and, as a result, physical dimensions of a capacitor may not have to be increased in order to provide a desired functionality.

Figure 2:
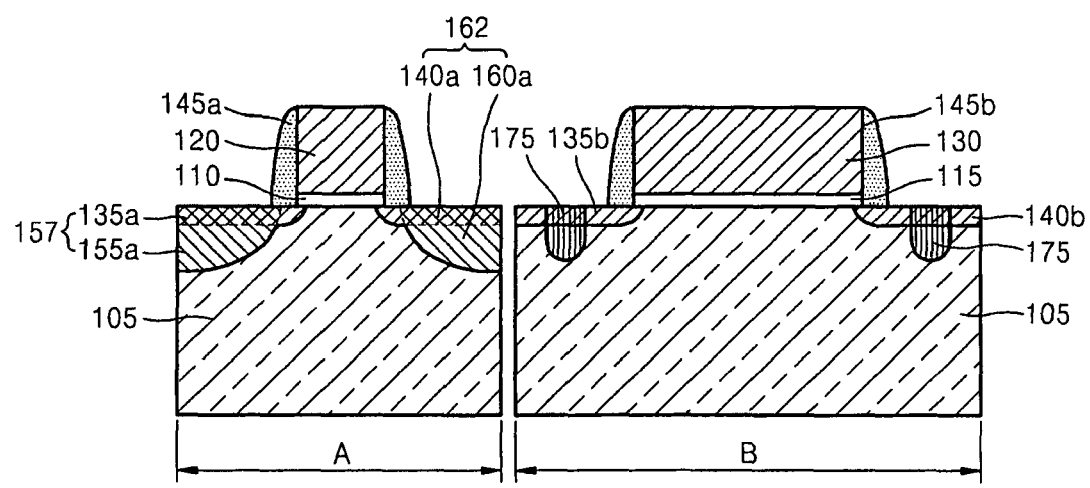
FIG. 2 illustrates a sectional view of a semiconductor device according to another embodiment of the present invention.

FIG. 2 illustrates a sectional view of a semiconductor device according to another embodiment of the present invention. The current embodiment may include a semiconductor device similar to the embodiment presented with reference to FIG. 1, with the addition of plug regions to second region B. It is noted that the particular elements that may be included in the embodiment illustrated in FIG. 2 may be similar to the description provided previously with respect to the semiconductor device illustrated in FIG. 1. Accordingly, only details that may be distinguishable from the previous embodiment will be described in detail hereinafter, and details and descriptions that may be found in both embodiments of the semiconductor device illustrated in FIGS. 1-2 may not be repeated.

Referring to FIG. 2, plug regions 175 may extend from surfaces of the second source region 135b and the second drain region 140b into the second region B. The plug regions 175 may define connection regions for connecting contact plugs (not shown) to the second source region 135b and the second drain region 140b. Therefore, the plug regions 175 may be spaced apart from an end of the upper electrode 130 by a particular distance.

An impurity doping concentration of the plug regions 175 may be greater than that of the second source region 135b and the second drain region 140b. Thus, a contact resistance may be formed between the contact plugs of plug regions 175 and the second source region 135b and the second drain region 140b. The contact resistance between the contact plugs of the plug regions 175 and the second source region 135b and the second drain region 140b may be relatively low, due at least in part to the impurity doping concentration of the second source region 135b and the second drain region 140b being relatively low.

Furthermore, the plug regions 175 may each be formed in the second region B to a depth. The depth may, for example, be similar to the depth of the high density regions 155a and 160a of first region A. Additionally, plug regions 175 may be formed each have an impurity doping concentration, and the impurity doping concentration may additionally be similar to the impurity doping concentration of high density regions 155a and 160a. An impurity doping concentration of the plug regions 175 may be greater than the impurity doping concentration of the second source region 135b and the second drain region 140b by about 5 to 1000 times. Moreover, the depth of the second source region 135b and the second drain region 140b may be about ⅓ to ½ of the depth of plug regions 175.

FIGS. 3 through 6 illustrate sectional views of various stages in the fabrication of a semiconductor device according to embodiments of the present invention.

Figure 3:
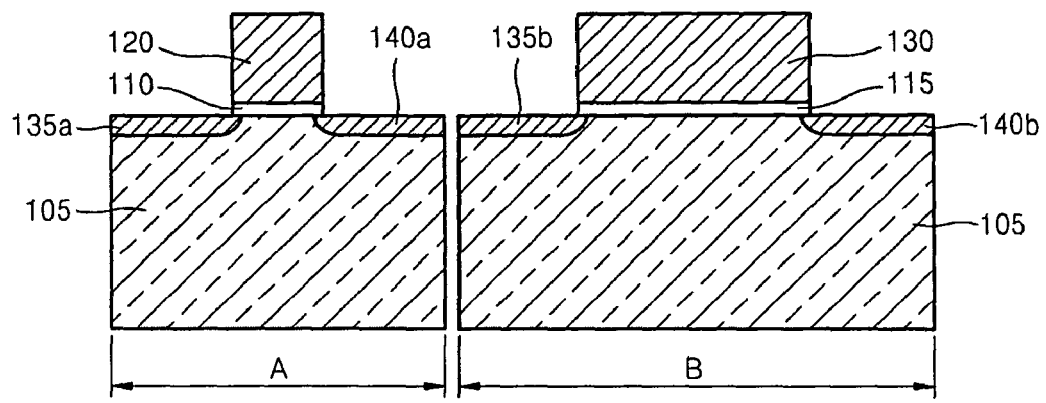
FIGS. 3 through 6 illustrate sectional views of various stages in the fabrication of a semiconductor device according to embodiments of the present invention.

FIG. 3 illustrates the semiconductor substrate 105 having the first region A and the second region B. The first region A and the second region B may be positioned adjacent to one another, or, alternatively, may be positioned remotely from one another on semiconductor substrate 105. If the first region A and the second region B are positioned adjacent to one another, a device isolation film (not shown) may be formed between them. The semiconductor substrate 105 may be formed from one or more materials, including silicon, germanium or silicon-germanium, for example, although those skilled in the art will appreciate that other materials not specifically named herein may be employed in other embodiments.

The gate insulating layer 110 may be disposed on a top surface of the semiconductor substrate 105 of the first region A. The gate electrode 120 may be formed on the first region A by disposing the gate electrode 120 on the gate insulating layer 110. Furthermore, the dielectric layer 115 may be disposed on a top surface of the semiconductor substrate 105 of the first region B, and the upper electrode 130 may be formed on first region B by disposing the upper electrode 130 on the dielectric layer 115. Although not illustrated in FIG. 3, during formation, an insulating layer (not shown) and a conductive layer (not shown) may be sequentially or simultaneously formed on the semiconductor substrate 105 on each of first region A and second region B, and, accordingly, the gate insulating layer 110 and the dielectric layer 115 may be formed from the same insulating layer, and the gate electrode 120 and the upper electrode 130 may be formed from the same conductive layer. This may result in simplification or reduced cost of the fabrication process. However, in other embodiments one or more portions of the above-described elements may be formed from differing fabrication processes or in a differing sequence. For example, the gate insulating layer 110 and the gate electrode 120 of the first region A may be formed prior to or after the formation of the dielectric layer 115 and the upper electrode 130.

Low density regions 135a and 140a may be formed in the first region A on either sidewall of the gate electrode 120, and second source region 135b and second drain region 140b may be formed in the second region B on either sidewall of the upper electrode 130. Low density regions 135a and 140a, the second source region 135b and the second drain region 140b may be simultaneously or sequentially formed. If, for example, low density regions 135a and 140a, the second source region 135b and the second drain region 140b are simultaneously formed, fabrication time and fabrication cost may be decreased.

The semiconductor substrate 105 may be doped with impurities of a first conductivity type, and, low density regions 135a and 140a, the second source region 135b and the second drain region 140b may be doped with impurities of a second conductivity type. The first conductivity type and the second conductivity type may include either one of n-type or p-type impurities, and may, for example, include the same impurity type in at least one embodiment. For example, the low density regions 135a and 140a, the second source region 135b and the second drain region 140b may be formed by implanting the impurities of the second conductivity type to a density of 1E12 to 5E14 atoms/cm2. In this example, the depth of low density regions 135a and 140a and the depth of the second source region 135b and the second drain region 140b may be approximately equal to one another.

Alternatively, the low density regions 135a and 140a, the second source region 135b and the second drain region 140b may not be simultaneously formed, and may additionally be formed to have impurity concentration different from one another. In this example, a doping concentration of the low density regions 135a and 140a may be selected to correspond with a desired performance of a resulting transistor, i.e., characteristics of a threshold voltage or hot-carriers. The doping concentration of the second source region 135b and the second drain region 140b may be selected to correspond with characteristics of a capacitance and a leakage current, for example.

Figure 4:
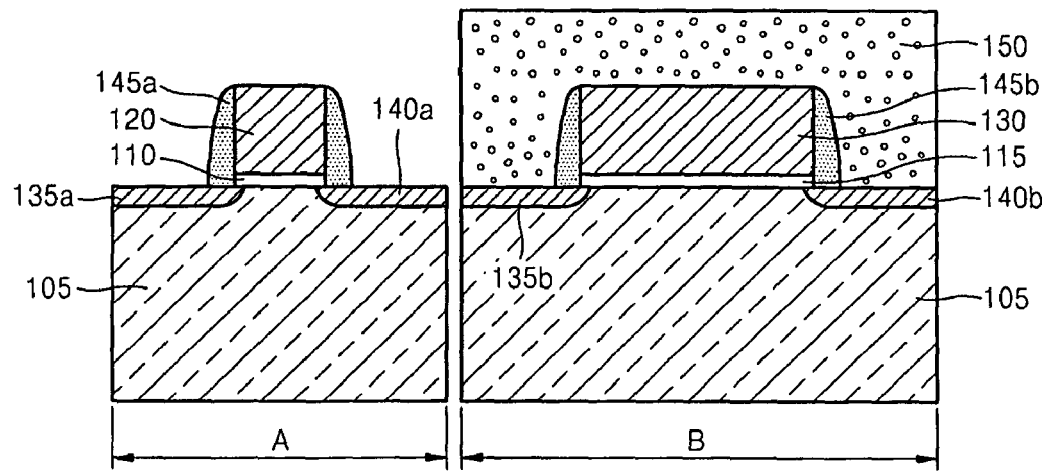

Referring to FIG. 4, first spacer insulating layers 145a may be formed on respective sidewalls of gate electrode 120 and second spacer insulating layers 145b may be formed on respective sidewalls of the upper electrode 130. Fabrication of first and second spacer insulating layers may be via one or more fabrication processes. As one example, an insulating layer may be formed to cover the gate electrode 120 and the upper electrode 130 may be formed, which may then be anisotropically etched to form the first and second spacer insulating layers 145a and 145b.

Second region B may subsequently be at least partially covered with a mask layer 150. The mask layer 150 may be used as a protection film to ion implantation and may include, e.g., a photoresist layer.

Figure 5:
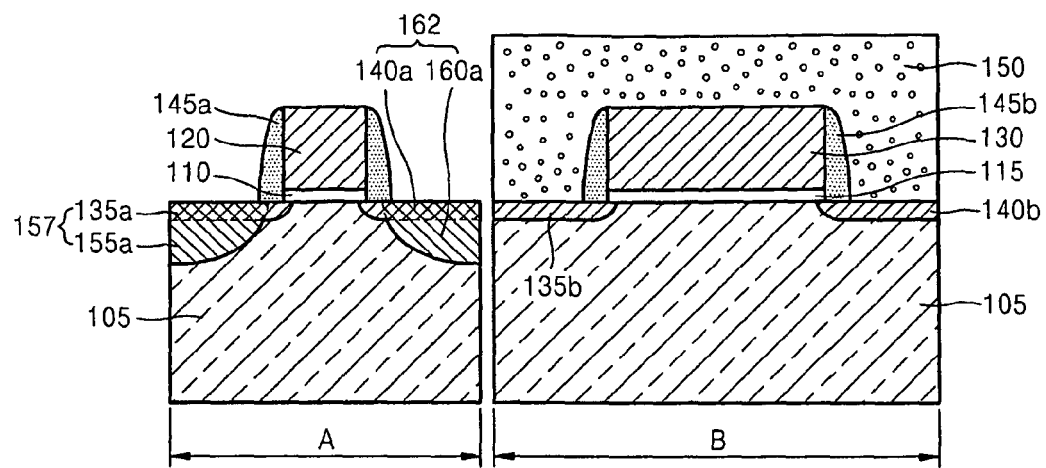

Referring to FIG. 5, the mask layer 150 may be employed as a protection film when fabricating high density regions 155a and 160a in the first region A, on respective sides of the gate electrode 120. For example, the high density regions 155a and 160a may be formed by implanting impurities of a second conductivity type at a dose of about 1E15 atoms/cm2 or greater. Therefore, the doping concentration of the high density regions 155a and 160a may be greater than the doping concentration of the low density regions 135a and 140a by about 5 to 1000 times.

Low density region 135a and high density region 155a may serve as, for example, the first source region 157. Furthermore, low density region 140a and high density region 160a may serve as, for example, the first drain region 162. In one example, doping concentration of the first source region 157 and the first drain region 162 may be greater than that of the second source region 135b and the second drain region 140b by about 5 to 1000 times. Furthermore, a depth of the second source region 135b and the second drain region 140b may be less than a depth of the first source region 157 and the first drain region 162 by about ⅓ to ½ times.

Figure 6:
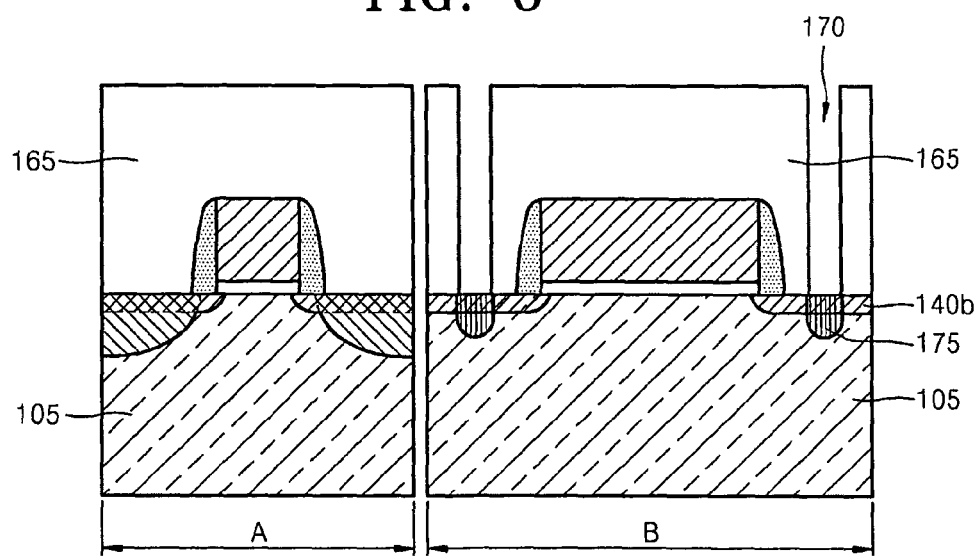

The first source region 157, the first drain region 162, the second source region 135b and the second drain region 140b may be activated by employing a thermal treatment after ion implantation and may then be enlarged by diffusion. Referring to FIG. 6, an interlayer insulating layer 165 may be formed on the first region A and the second region B. After formation, contact holes 170 may be formed that at least partially expose a portion of second source region 135b or the second drain region 140b on the second region B spaced apart from the upper electrode 130 in the interlayer insulating layer 165. Impurities of the second conductivity type may be implanted to the contact holes 170 to form plug regions 175. Plug regions 175 may be formed to extend to the inside of the second region B from the surfaces of the second source region 135b and the second drain region 140b.

A dose of the impurities for forming the plug regions 175 may be similar to that of a dose employed to form high density regions 155a and 160a. Accordingly, the plug region 175 may be formed to have an impurity doping concentration higher than that of second source regions 135b and the second drain region 140b, and may be formed to a depth greater than that of second source regions 135b and the second drain region 140b. For example, the impurity doping concentration of the plug regions 175 may be formed to have a greater impurity doping concentration of the second source region 135b and the second drain region 140b by about 5 to 1000 times.

Accordingly, a semiconductor device maybe formed by employing a method well known to an ordinary skill in the art, and may result in the formation of a semiconductor device including a MOS transistor and a MOS capacitor for example.

Figure 8:
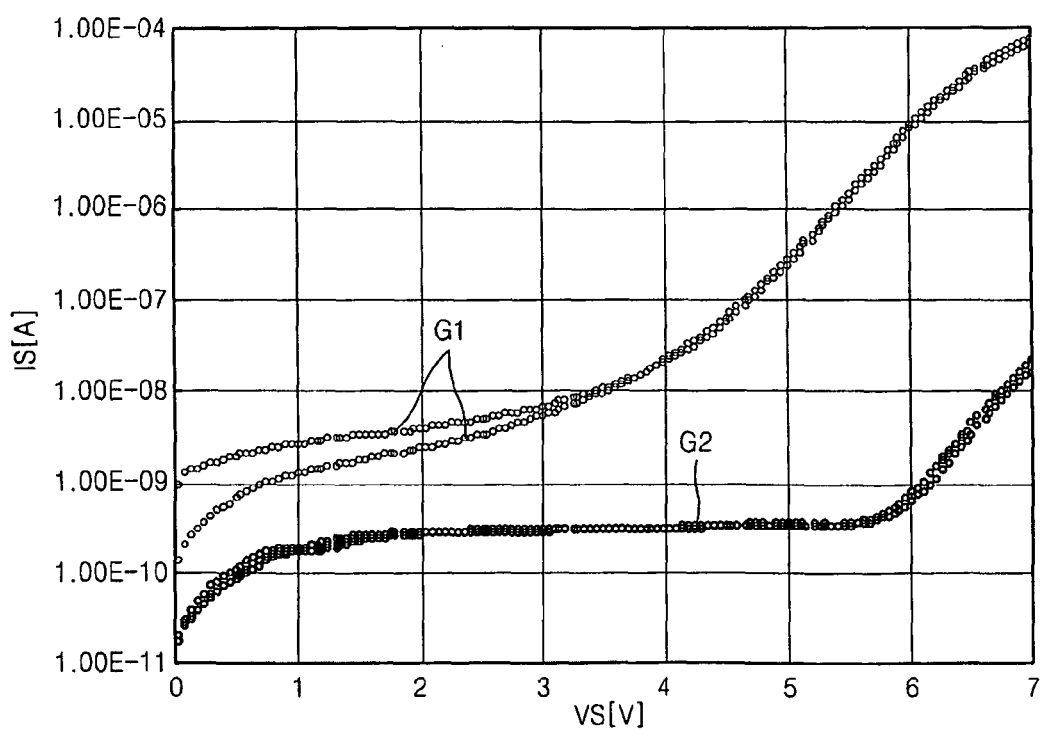
FIG. 8 illustrates a graph of voltage-current characteristics of various embodiments of the present invention.

FIG. 8 illustrates a graph of voltage-current characteristics of embodiments of the present invention, using comparative example G1 and experimental example G2. These examples demonstrate voltage vs. leakage current characteristics of an experimental example of portions of the semiconductor device illustrated in one or more of FIG. 1 or FIG. 2. In comparative example G1, a doping concentration of the first source region 157 and the first drain region 162 is greater than that of the experimental example G2 by about 500 times. As voltage VS was supplied to the second source region 135b and the second drain region 140b, and the upper electrode 130 was grounded, the graph of FIG. 8 demonstrates that a leakage current IS from the second source region 135b and the second drain region 140b through the peripheries of the dielectric layer 115 in experimental example G2 was much lower than that of comparative example G1. More specifically, the leakage current IS of experimental example G2 is less than of the leakage current IS of comparative example G1 by about ¹⁄₁₀ to ¹⁄₁₀,₀₀₀.

As can be seen from the graph illustrated in FIG. 8, leakage current IS through the dielectric layer 115 may be greatly decreased by decreasing the impurity doping concentration of the second source region 135b and the second drain region 140b, which may result in an increase in the reliability of the dielectric layer 115. Such a decrease of the leakage current IS results from the decrease of an electrical field applied on the dielectric layer 115 as described with reference to FIG. 7.

Figure 9:
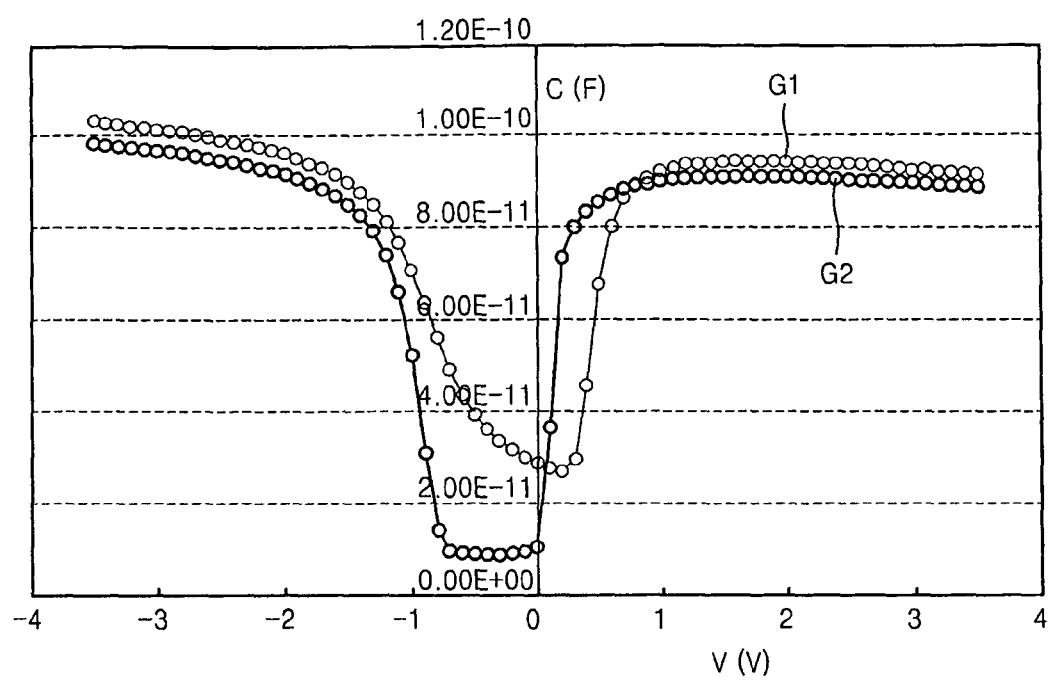
FIG. 9 illustrates a graph of voltage-capacitance characteristics with respect to various embodiments of the present invention.

FIG. 9 illustrates a graph of voltage-capacitance characteristics with respect to comparative example G1 and experimental example G2 of the present invention, which illustrates voltage-capacitance characteristics of portions of the semiconductor device illustrated in one or more of FIG. 1 or FIG. 2. The graph illustrated in FIG. 9 demonstrates that a capacitance C is similar in both the comparative example G1 and the experimental example G2. Without intending to be bound by theory, this may be due at least in part to a size of a channel region (not shown) in comparative example G1 being similar to a size of a channel region in experimental example G2.

As can be seen from the graph illustrated in FIG. 9, in experimental example G2, leakage current may be decreased through the dielectric layer 115 while having the similar capacitance C as compared to comparative example G1. Furthermore, capacitance of a capacitor may be maintained while a leakage current through a dielectric layer may be greatly decreased. Thus, an operation voltage of the capacitor may not have to be decreased in at least one embodiment. Consequently, it may not be necessary to increase dimensions of a capacitor in order to obtain desired performance characteristics.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made therein without departing from the spirit and scope of the present invention as set forth in the following claims.

What is claimed is:
1. A semiconductor device, comprising:
a semiconductor substrate having a first region and a second region;
a gate electrode on the first region, the gate electrode having a first sidewall and a second sidewall;
a first source region in the first region proximate to the first sidewall of the gate electrode;
a first drain region in the first region proximate to the second sidewall of the gate electrode;
an upper electrode on the second region, the upper electrode having a first sidewall and a second sidewall;
a second source region in the second region proximate to the first sidewall of the upper electrode; and
a second drain region in the second region proximate to the second sidewall of the upper electrode, wherein:
an impurity doping concentration of the first source region and the first drain region is greater than an impurity doping concentration of the second source region and the second drain region,
a depth of the second source region and the second drain region is about ⅓ to ½ of a depth of the first source region and the first drain region, and
plug regions extend into the second region and defining electrical connection regions of the second source region and the second drain region, the plug regions being offset from the upper electrode, a depth of the plug regions being greater than a depth of the second source region and the second drain region, and each plug region dividing one of the second source region and the second drain region into at least two portions such that the plug region is disposed between the at least two portions.

2. The semiconductor device as claimed in claim 1, wherein the impurity doping concentration of the first source region and the first drain region is greater than the impurity doping concentration of the second source region and the second drain region by about 5 to 1000 times.

3. The semiconductor device as claimed in claim 1, wherein an impurity doping concentration of the plug regions is greater than the impurity doping concentration of the second source region and the second drain region.

4. The semiconductor device as claimed in claim 3, wherein the impurity doping concentration of the plug regions is greater than that of the second source region and the second drain region by about 5 to 1000 times.

5. The semiconductor device as claimed in claim 1, wherein the first region comprises a cell region, and the second region comprises a peripheral circuit region.

6. A method of fabricating a semiconductor device, comprising:
- providing a semiconductor substrate having a first region and a second region;
- forming a gate electrode on the first region, the gate electrode having a first sidewall and a second sidewall;
- forming a first source region in the first region proximate to the first sidewall of the gate electrode;
- forming a first drain region in the first region proximate to the second sidewall of the gate electrode;
- forming an upper electrode on the second region, the upper electrode having a first sidewall and a second sidewall;
- forming a second source region in the second region proximate to the first sidewall of the upper electrode;
- forming a second drain region in the second region proximate to the second sidewall of the upper electrode; and
- forming a plug region extending into the second region and defining an electrical connection region of at least one of the second source region and the second drain region after forming the second source region or the second drain region, the plug region being formed to be offset from the upper electrode, wherein
- an impurity doping concentration of the first source region and the first drain region is greater than an impurity doping concentration of the second source region and the second drain region.
- a depth of the second source region and the second drain region is about ⅓ to ½ of a depth of the first source region and the first drain region, and
- a depth of the plug region is greater than a depth of the second source region and the second drain region, the plug region dividing one of the second source region and the second drain region into at least two portions such that the plug region is disposed between the at least two portions.

7. The method as claimed in claim 6, wherein the forming of the first source region and the first drain region further comprises:
- forming low density regions having a first impurity doping concentration in the first region proximate to the first sidewall and the second sidewall of the gate electrode;
- forming first spacer insulating layers on the first sidewall and the second sidewall of the gate electrode; and
- forming high density regions having a second impurity doping concentration greater than the first impurity doping concentration in the first region proximate to the first sidewall and the second sidewall of the gate electrode.

8. The method as claimed in claim 7, further comprising forming the second source region and the second drain region simultaneously with the formation of the low density regions, wherein the second source region and the second drain region are formed to have an impurity doping concentration equal to the first impurity doping concentration.

9. The method as claimed in claim 8, further comprising forming a mask layer on the second region prior to forming the high density region.

10. The method as claimed in claim 6, wherein an impurity doping concentration of the plug region is greater than that of the second source region and the second drain region by about 5 to 1000 times.

11. The method as claimed in claim 6, wherein the impurity doping concentration of the first source region and the first drain region is greater than that of the second source region and the second drain region by about 5 to 1000 times.

12. The method as claimed in claim 6, wherein the first region comprises a cell region, and the second region comprises a peripheral circuit region.

13. The method as claimed in claim 6, wherein the plug region disposed between the at least two portions of the one of the second source region and the second drain region has an impurity doping concentration that is greater than an impurity doping concentration of the at least two portions of the one of the second source region and the second drain region.

14. The method as claimed in claim 6, further comprising forming spacer insulating layers on the first and second sidewalls of the upper electrode, and the plug region disposed between the at least two portions of the one of the second source region and the second drain region being spaced apart from the spacer insulating layers.

15. The semiconductor device as claimed in claim 1, wherein each plug region disposed between at least two portions of the one of the second source region and the second drain region has an impurity doping concentration that is greater than an impurity doping concentration of the at least two portions of the one of the second source region and the second drain region.

16. The semiconductor device as claimed in claim 1, further comprising spacer insulating layers on the first and second sidewalls of the upper electrode, and the corresponding plug region disposed between the at least two portions of the one of the second source region and the second drain region being spaced apart from the spacer insulating layers.

* * * * *